United States Patent
Koukkari et al.

(10) Patent No.: US 7,113,035 B2
(45) Date of Patent: Sep. 26, 2006

(54) ELECTRONIC CIRCUIT

(75) Inventors: Eero Koukkari, Oulu (FI); Tero Oilinki, Utajarvi (FI); Pasi Kurttio, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/851,650

(22) Filed: May 24, 2004

(65) Prior Publication Data

US 2005/0168282 A1   Aug. 4, 2005

(30) Foreign Application Priority Data

Jan. 30, 2004   (FI) ................................. 20040139

(51) Int. Cl.
*H03G 3/20* (2006.01)
(52) U.S. Cl. ....................... 330/136; 330/149
(58) Field of Classification Search ..................... None
See application file for complete search history.

(56) References Cited

U.S. PATENT DOCUMENTS

| | | | |
|---|---|---|---|
| 5,742,201 A | 4/1998 | Eisenberg et al. | 330/280 |
| 6,337,599 B1 * | 1/2002 | Lee | 330/149 |
| 6,600,368 B1 * | 7/2003 | Kim | 330/136 |
| 6,714,073 B1 * | 3/2004 | Suto et al. | 330/136 |
| 6,735,419 B1 * | 5/2004 | Mitzlaff | 455/127.1 |
| 6,859,101 B1 | 2/2005 | Leffel | 330/2 |
| 2002/0094795 A1 | 7/2002 | Mitzlaff | 455/245.1 |

FOREIGN PATENT DOCUMENTS

| | | |
|---|---|---|
| EP | 1 191 685 A2 | 3/2002 |
| EP | 1 199 797 A1 | 4/2002 |

* cited by examiner

*Primary Examiner*—Khanh Van Nguyen
(74) *Attorney, Agent, or Firm*—Squire, Sanders and Dempsey, LLP.

(57) ABSTRACT

An electronic circuit for adjusting a property of an input signal of a non-linear element is disclosed. A detector detects a strength of the input signal. An analog controller forms a control signal as a piecewise approximation of a non-linear dependency between the property and the strength of the input signal detected by the detector. An adjusting circuit adjusts the property of the input signal according to the control signal from a controller.

14 Claims, 4 Drawing Sheets

ELECTRONIC CIRCUIT

FIELD

The invention relates to an electronic circuit for adjusting an input signal of a non-linear element.

BACKGROUND

A non-linear element, for example a power amplifier, causes distortion to a signal. Reduction of distortion caused by amplifiers has been attempted by various means. Because the distortion of amplitude or phase as a function of amplitude of an input signal often resembles a known function, distortion has been compensated for with a component having a similar characteristic behaviour. Typical components for predistortion include a diode, a field effect transistor or a bipolar junction transistor. Although this solution is simple, it is also inaccurate. A characteristic curve of one component cannot well enough cancel the distortion of a non-linear element, such as a power amplifier.

Predistortion can be performed by using look-up tables, which can, in addition, be updated in order to achieve adaptability since amplifier distortion is affected by temperature, age of the amplifier and changes of the signal fed to the amplifier, for example.

Instead of look-up tables, a polynomial higher than the first order can be used to estimate distortion. Typically, the order has to be at least five or even seven for cancelling the distortion well enough. This, however, increases the number of multiplication operations drastically.

Look-up tables and polynomials result in very complicated and non-ideal compensation circuits which cause problematic delays in signal processing. Furthermore, multiplication operators used in a polynomial solution are difficult to implement and cause unnecessary delay. Irrespective of whether or not a linearization is used, power amplifiers cannot, thus, linearly amplify a signal if the power level of the incoming signal varies, which is the case e.g. in UMTS (Universal Mobile Telephone System), CDMA (Code Division Multiple Access) and WCDMA (Wide-band CDMA) radio systems.

BRIEF DESCRIPTION OF THE INVENTION

An object of the invention is to provide an improved circuit of adjusting an input signal of a non-linear element.

According to an aspect of the invention, there is provided an electronic circuit for adjusting at least one property of an input signal of a non-linear element, the circuit comprising a detector for detecting a strength of the input signal; at least one analog controller for forming at least one control signal as a piecewise approximation of a non-linear dependency between the at least one property and the strength of the input signal detected by the detector; and at least one adjusting circuit for adjusting the at least one property of the input signal according to the at least one control signal from at least one controller.

According to another aspect of the invention, there is provided an electronic circuit for adjusting an amplitude of an input signal of an amplifier, the circuit comprising a detector for detecting a strength of the input signal; an analog controller for forming a control signal as a piecewise approximation of a non-linear dependency between the at least one property and the strength of the input signal detected by the detector; and an adjusting circuit for adjusting the amplitude of the input signal according to the control signal.

According to another aspect of the invention, there is provided an electronic circuit for adjusting a phase of an input signal of an amplifier, the circuit comprising a detector for detecting a strength of the input signal; an analog controller for forming a control signal as a piecewise approximation of a non-linear dependency between the at least one property and the strength of the input signal detected by the detector; and an adjusting circuit for adjusting the phase of the input signal according to the control signal.

According to another aspect of the invention, there is provided a method of adjusting at least one property of an input signal of a non-linear element, the method comprising detecting, by a detector, a strength of the input signal; forming, by at least one analog controller, at least one control signal as a piecewise approximation of a non-linear dependency between the at least one property and the strength of the input signal detected by the detector; and adjusting, by at least one adjusting circuit, the at least one property of the input signal according to the at least one control signal from at least one controller.

Preferred embodiments of the invention are described in the dependent claims.

The method and system of the invention provide several advantages. The circuit is simple and it can easily be tuned to the non-linear element and to the desired behaviour. The circuit has a short delay.

LIST OF DRAWINGS

In the following, the invention will be described in greater detail with reference to the preferred embodiments and the accompanying drawings, in which FIG. 1 shows a radio system;

DESCRIPTION OF EMBODIMENTS

The present solution is particularly suitable for a transmitter in a radio system such as UMTS or WCDMA without, however, being limited thereto.

Figure 1:
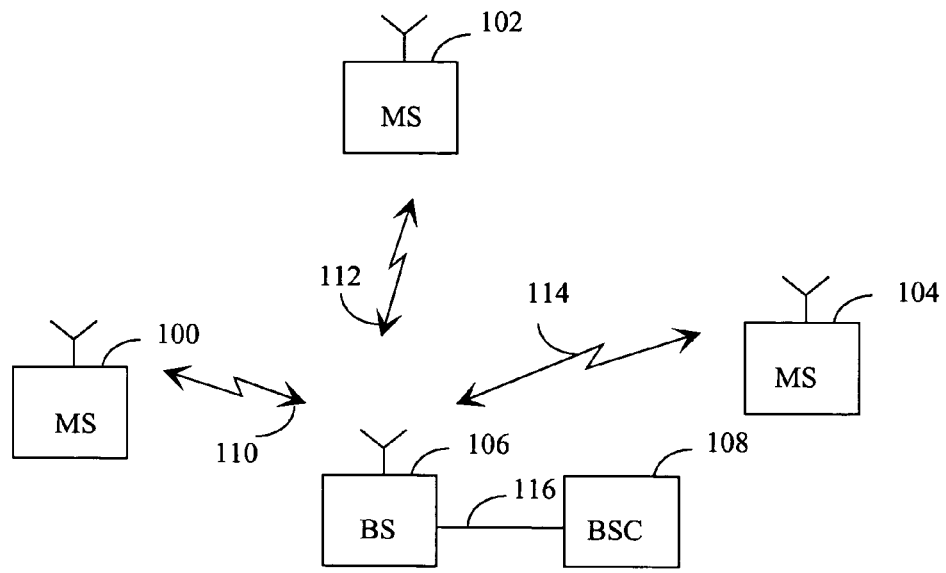

First the radio system is described by means of FIG. 1. A typical digital radio system comprises subscriber equipment 100 to 104, at least one base station 106, and a base station controller 108. The base station 106 can also be called node B and the base station controller 108 can be called a radio network controller. The subscriber equipment 100 to 104 communicates with the base station 106 using signals 110 to 114. The base station 106 can be connected to the base station controller 108 by a digital transmission link 116. The subscriber equipment 100 to 104 may be fixedly installed terminals, user equipment installed in a vehicle or portable mobile terminals. The signals 110 to 114 between the subscriber equipment 100 to 104 and the base station 106 carry digitized information, which is e.g. speech or data information or control information produced by subscribers or by the radio system.

According to the present solution, an electronic circuit is used to adjust at least one property of an input signal of a non-linear element. The property can be the gain or phase of the non-linear element. An element can be considered linear if the relation of its output power and input power is constant, i.e. $P_{output}/P_{input}=c_1$, where $P_{output}$ is output power and $P_{input}$ is input power and $c_1$ is a constant. The strength of a signal can be measured as voltage or power. In a linear element, the relation of the output voltage and the input voltage is constant, i.e. $V_{output}/V_{input}=c_2$, where $V_{output}$ is output voltage and $V_{input}$ is input voltage and $c_2$ is a constant. Linearity can also be defined such that the phase shift caused by a linear element is constant at all power levels of the input signal. In such a case, the difference between the phase of the output signal and the phase of the input signal is constant independent of the power level of the input signal.

Figure 2:
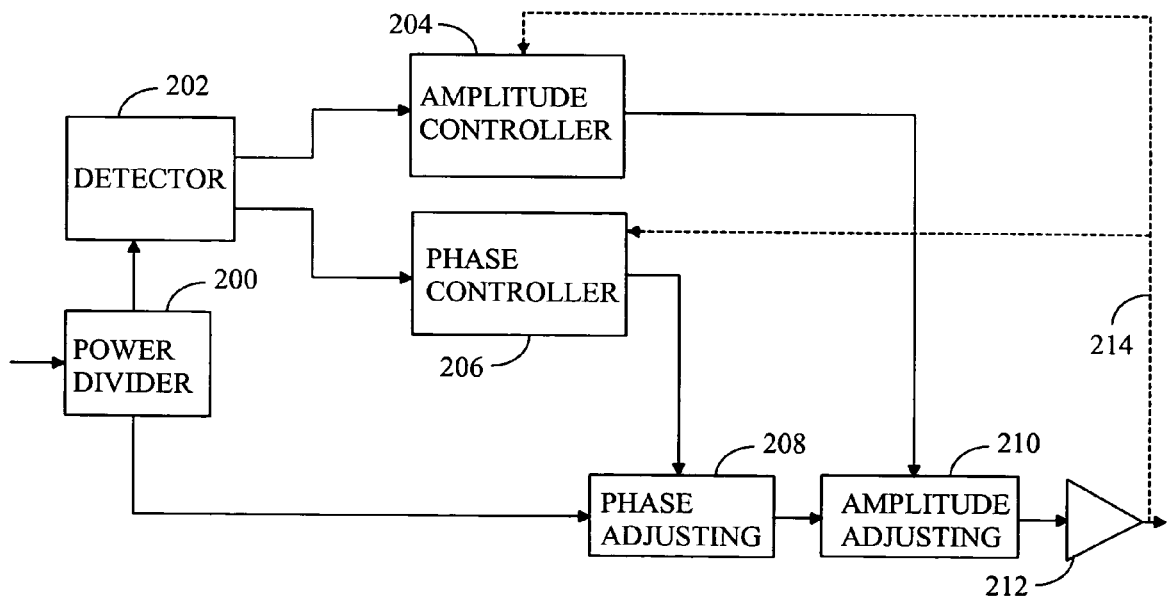
FIG. 2 shows an adjusting circuit.

As an example, in FIG. 2 a power divider 200 divides a signal to be input to a non-linear element into two components, the first of which enters a detector 202 and the second of which proceeds to at least one adjusting circuit 208, 210. The second signal component may be delayed (the feature is not shown in FIG. 2) such that the delay corresponds to the delay of the first signal component in the detector 202 and in at least one analog controller 204, 206. The detector 202 detects the power of the signal, and it may be an envelope detector. An output signal of the detector 202 is fed to at least one analog controller 204, 206, each of which forms a control signal as a piecewise approximation of a non-linear dependency between the at least one property and the detected power of the input signal. The analog controllers in the example of FIG. 2 may be an amplitude controller 204 and a phase controller 206. The control signal from each analog controller 204, 206 may be fed to a corresponding adjusting circuit 208, 210 for adjusting the at least one property of the second signal component according to the control signals. The input signal with at least one property controlled then enters a non-linear element 212. Since the non-linear element 212 may be a power amplifier amplifying a radio frequency signal, the amplified signal may be fed to an antenna for transmitting the signal as electromagnetic radiation. The signal to be amplified may also be a received signal which proceeds from the antenna to the amplifier. The radio frequency signal can be a base band signal or a signal modulated by a carrier, the frequency of which may vary from kilohertzes to gigahertzes. Thus, the electronic circuit can be applied, for instance, to a base station or mobile equipment.

The piecewise approximation may be inverse to the non-linear behaviour of the non-linear element 212 and hence an embodiment of the present solution may be used to linearize the non-linear element. Otherwise an embodiment of the present solution may be used to produce at least one desired non-linear effect on a signal.

An embodiment of the present solution may include a feedback 214 from the output of the non-linear element 212 to the at least one controller 204, 206 (shown with a dashed line), but this feature is not necessary. The feedback may comprise a feedback converter (not shown) for each controller 204, 206 which converts the output signal of the non-linear element 212 into a form suitable for the controller 204, 206. Instead of or in addition to the output signal of the non-linear element 212 the feedback signal 214 may transfer information, for example, on properties such as temperature or humidity relating to the non-linear element 212 to the controllers 204, 206 for compensating for the effect of the properties.

Figure 3:
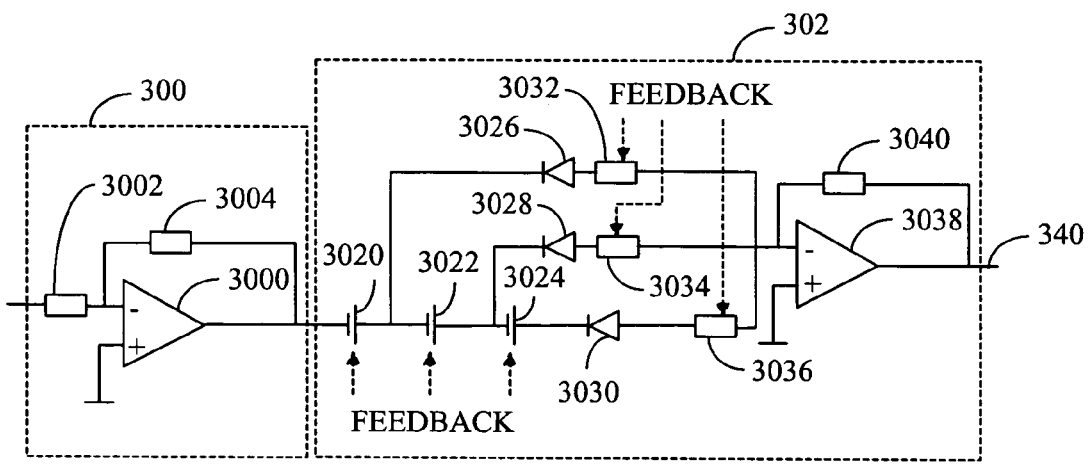
FIG. 3 shows a circuit of a controller.

In FIG. 3, an analog controller is shown with more details. This example includes two inverting stages. The first stage 300 is a buffer between the detector and the actual controlling stage 302. The first stage 300 may include an operational amplifier or a transistor 3000 and two resistors 3002 and 3004 which may have the same value, resulting in total amplification of −1. Generally, the total amplification results in $A=-R_{s1}/R_i$, where $R_{s1}$ means a shunt resistor 3004 and $R_i$ means the input resistor 3002. The buffer stage 300 is not always needed in principle. The buffer, however, can be used to separate the detector from the controller and to decrease loading of the controller.

As in FIG. 3, the actual controlling stage 302 may include three voltage generators 3020 to 3024, three non-linear components 3026 to 3030, input resistors 3032 to 3036, an amplifier 3038 and a shunt resistor 3040. The amplifier 3038 may be a transistor or an operational amplifier. In general, the actual controlling stage 302 may include N or N+1 voltage generators and N+1 non-linear components, where N is at least one. The reason for using only N voltage generators is that the first voltage generator corresponding to the voltage generator 3020 in FIG. 3 may be omitted. The voltage generator 3020 may also be placed in the buffer 300 such that the voltage generator 3020 is coupled, for example, between ground and the positive terminal of the amplifier 3000. All input resistors 3032 to 3036 are not necessarily needed, but if they are used their number may be N+1 in general.

The analog controller may include at least one voltage generator 3020 to 3024 coupled in series, at least two non-linear components 3026 to 3030 like diodes coupled in parallel, and an operational amplifier 3038. Each of the at least two non-linear components 3026 to 3030 has a series resistor 3032 to 3036, and each of the at least two non-linear components 3026 to 3030 in series with a resistor 3032 to 3036 is biased to a different voltage with at least one voltage generator 3020 to 3024. The operational amplifier 3038 with a shunt resistor 3040 then combines the voltages from the parallel coupling of the non-linear components 3026 to 3030 into a control signal.

Instead of series coupling, the voltage generators 3020 to 3024 may be coupled in parallel. In a similar manner, the at least non-linear components 3026 to 3030 can be coupled in series. It is also possible to couple, for example, four voltage generators such that two voltage generators are coupled in parallel and two other voltage generators are coupled in series. These can be coupled with the non-linear components having a series coupling or parallel coupling. There is are many ways to couple the components, and because a transform (correspondence) between a series coupling and a parallel coupling per se is obvious, the variations in coupling possibilities are not shown.

Assume that the non-linear components 3026 to 3030 are forward biased diodes whose resistance is considered to behave in the simplest possible way such that the resistance is infinite below an offset voltage $U_{th}$ and zero above the offset voltage $U_{th}$. The offset voltage of a diode may be 0.7V. The buffer amplifier stage 300 inverts the signal from the detector. When the voltage of the input signal is less than $U_1+U_{th}$, the output of the input buffer amplifier stage 300 is less than $-U_1-U_{th}$ and the output 340 of the controller is zero. The slope, i.e. the derivative of the dependence between the input voltage and the voltage of the output 340 of the controller, can also be considered zero in the first piece of the piecewise approximation if the first piece is assumed to be linear.

When the input power measured as voltage reaches $U_1+U_{th}$, the diode $D_1$ 3026 in series with the resistor $R_1$ 3032 starts to conduct. Above $U_1+U_{th}$ the voltage between the diode 3026 and resistor 3032 is $-U_{in}+U_1+U_{th}$. This causes the current through the resistor 3032 and the output of the controller to swing upwards. The differential gain G of the controller is now $G=(-R_{s1}/R_i)\cdot(-R_{s2}/R_1)=(-1)\cdot(-R_{s2}/R_1)=R_{s2}/R_1$ which can be considered a slope of the dependence between the input power and the voltage of the output 340 of the controller in the second piece of the piecewise approximation if the second piece is assumed to be linear. Hence, at the threshold point $U_1+U_{th}$ the dependency between the input voltage and the voltage of the output 340 of the controller changes from one approximation to another.

If the signal level increases until the detector output voltage reaches $U_1+U_2+U_{th}$, the diode $D_2$ 3028 starts to conduct through the resistor $R_2$ 3034. The differential gain G of the controller is now increased to $$G = (-R_{s1}/R_i)\cdot(-R_{s2}/(R_1\|R_2))$$
$$= (-1)\cdot(-R_{s2}/(R_1\|R_2))$$
$$= R_{s2}\left(\frac{1}{R_1}+\frac{1}{R_2}\right)$$

which can be considered a slope of the dependence between the input power and the voltage of the output 340 of the controller in the third piece of the piecewise approximation if the third piece is assumed to be linear. Hence, at the threshold point $U_1+U_2+U_{th}$ the dependency between the input voltage and the voltage of the output 340 of the controller changes once again.

If the signal level still increases until the detector output voltage reaches $U_1+U_2+U_3+U_{th}$, the diode $D_3$ 3030 starts to conduct through the resistor $R_3$ 3036. The differential gain G has now increased to $$G = (-R_{s1}/R_i)\cdot(-R_{s2}/(R_1\|R_2\|R_3))$$
$$= (-1)\cdot(-R_{s2}/(R_1\|R_2\|R_3))$$
$$= R_{s2}\left(\frac{1}{R_1}+\frac{1}{R_2}+\frac{1}{R_3}\right),$$

which can be considered a slope of the dependence between the input power and the voltage of the output 340 of the controller in the fourth piece of the piecewise approximation if the fourth piece is assumed to be linear. Hence, at the threshold point $U_1+U_2+U_3+U_{th}$ the dependency between the input voltage and the voltage of the output 340 of the controller changes.

According to this kind of piecewise linear approximation, the curve representing the voltage of the control signal suddenly turns at the threshold points, which means that the curve has a discontinuous derivative in the threshold points. In reality, the behaviour of the diodes can be considered much more complicated, and hence, the pieces in the approximation are not exactly linear. This is an advantage. In the threshold points, the slope of the control signal does not actually turn suddenly, but may be considered to have a continued derivative, and the voltage in the control signal changes smoothly from piece to piece in the piecewise approximation. The smoothness in the threshold points can be controlled by designing the circuit properly.

The voltage generators 3020 to 3024 are used to determine each threshold point at which the control signal changes from one approximation of the piecewise approximation to another. The non-linear components such as diodes 3026 to 3030, may have an effect on the threshold points.

The output of the non-linear element may be connected to the voltage generators 3020 to 3024 and/or resistors 3032 to 3036 as a feedback signal. In this case, the voltage generators 3020 to 3024 and/or resistors 3032 to 3036 may be adjustable according to the feedback signal. Additionally, depending on the non-linear components, the feedback signal may also adjust the operation of the non-linear components 3026 to 3030. Thus, the piecewisely changing voltage of the control signal may be adaptive with respect to the values of the threshold points and to the steepness of the slope (or curve form) in each piece. The feedback signal may be the output signal of the non-linear component or the feedback signal may relate to the state of the non-linear component, such as temperature for compensating temperature drift.

An advantage of the circuit is that the parameters can be adjusted with respect to the non-linear element and to the desired behaviour. The differential gains in each piece of the piecewise approximation can be adjusted by selecting suitable resistors 3032 to 3036. Instead of selecting suitable resistors, the use of adjustable resistors enables adjustment of resistor values. The total gain of a controller can be adjusted by the resistor 3040. The resistor 3040 may have a fixed value or the resistor 3040 may be adjustable. The number of parallel couplings in the controller determines how well the actual behaviour corresponds to the desired behaviour. The more parallel couplings, threshold points and pieces in the approximation, the more accurately the actual behaviour follows the desired non-linear behaviour.

If a feedback (the reference number 214 in FIG. 2) is used, the feedback signal may change the parameters of the piecewise approximation. The parameters may include the voltage level in the generators 3020 to 3024 and/or the resistances of the resistors 3032 to 3036. The operating values of other components can also be changed by the feedback. These can change the threshold points and the slopes (or the forms) of the pieces of the piecewise approximation.

Figure 4:
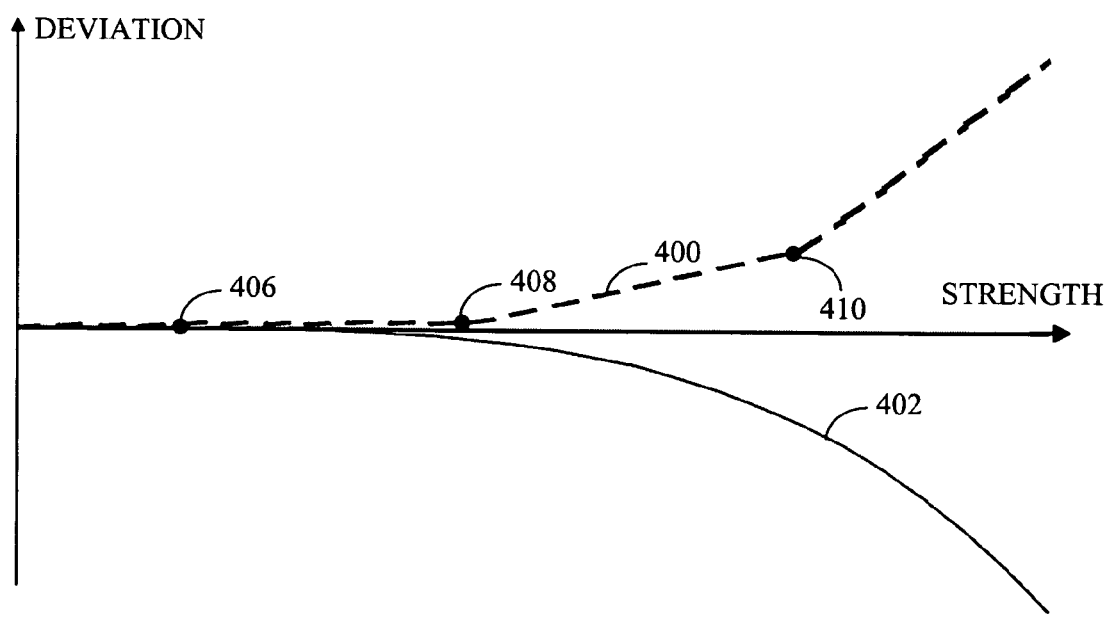
FIG. 4 illustrates dependence between a controlled property and input signal strength.

FIG. 4 shows non-linear behaviour and its piecewise approximation. The x-axis represents the detected power of the input signal and the y-axis represents distortion. In a typical amplifier, distortion, such as a phase delay, increases non-linearly when the signal power increases. The normalized phase delay of the amplifier is shown as curve 402. A piecewise linear operation of a controller corresponds to the piecewise approximation 400. The three threshold points 406 to 410 correspond to the threshold points determined by the voltage generators 3020 to 3024 in FIG. 3.

A detector converts the power of the input signal to voltage having amplitude information. This voltage at the output of the detector is converted to a piecewisely changing voltage dependency between the input signal power and the controlled property, such as phase or amplitude. The higher the power, the higher the voltage at the output of the controller. This voltage controls the corresponding adjusting circuit such that, for example, a phase adjusting circuit advances the signal going to the amplifier and compensates for the phase lag of the non-linear element. The amplitude adjusting circuit, correspondingly, increases the signal level going to the amplifier and compensates for the gain drop of the non-linear element.

The reshaping piecewise curve 400 may be chosen to advance the phase so as to cancel the phase lag of the non-linear element at all input signal power levels. As a result, the non-linear element may have a linear output phase for all signal levels.

The reshaping piecewise curve 400 may be chosen to amplify the signal so as to cancel the drop in amplification of the non-linear element at all input signal power levels. As a result, the non-linear element may have a linear output amplitude (constant gain) for all signal levels.

The present solution may be an integrated or a discrete electronic circuit. The diodes may be schottky diodes.

Figure 5:
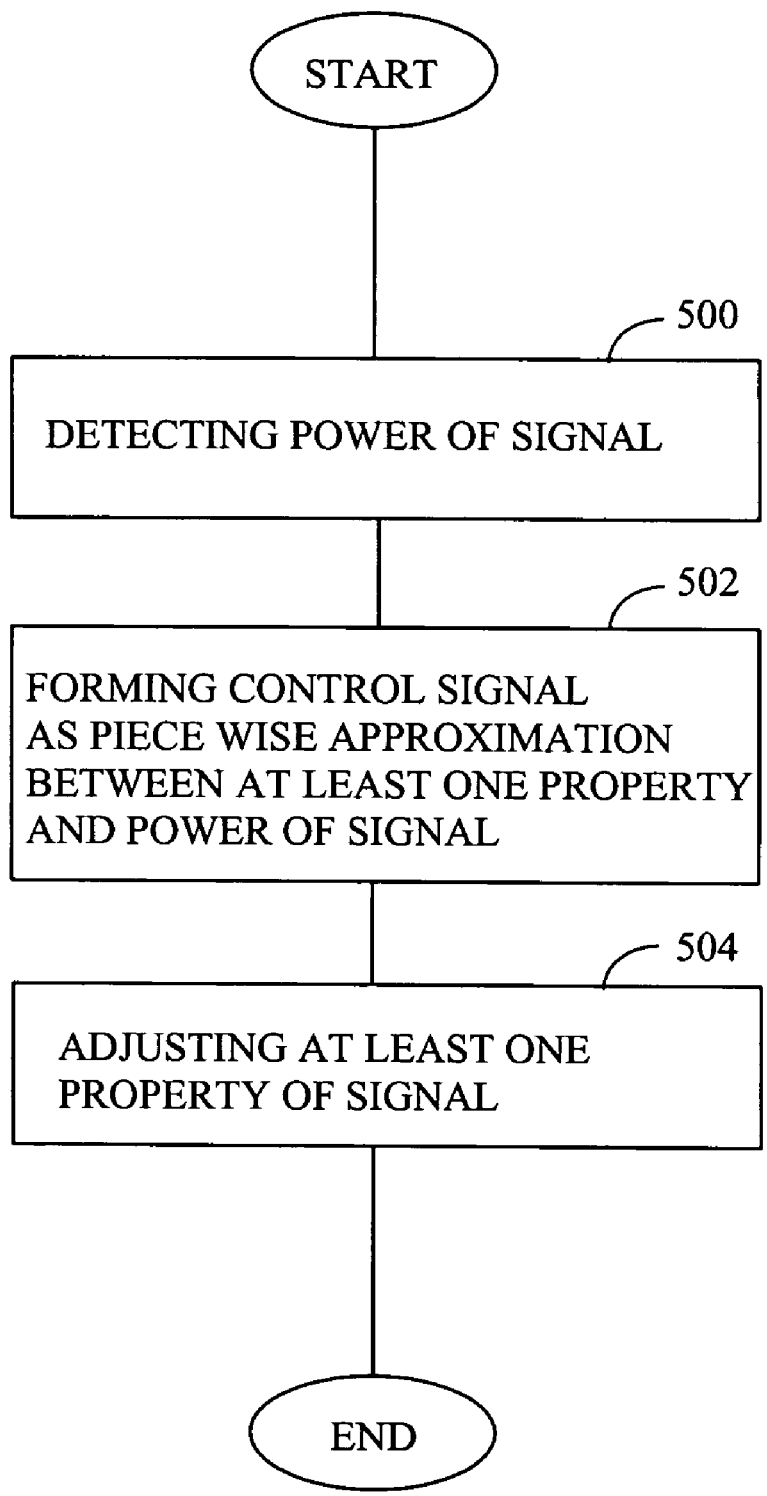
FIG. 5 illustrates a flow diagram of the method steps.

Finally, a flow diagram in FIG. 5 shows the main method steps. In step 500, a detector detects the power of an input signal. In step 502, at least one analog controller forms at least one control signal as a piecewise approximation of a non-linear dependency between the at least one property and the power of the input signal detected by the detector. In step 504, at least one adjusting circuit adjusts the at least one property of the input signal according to the at least one control signal from at least one controller.

Figure 6A:
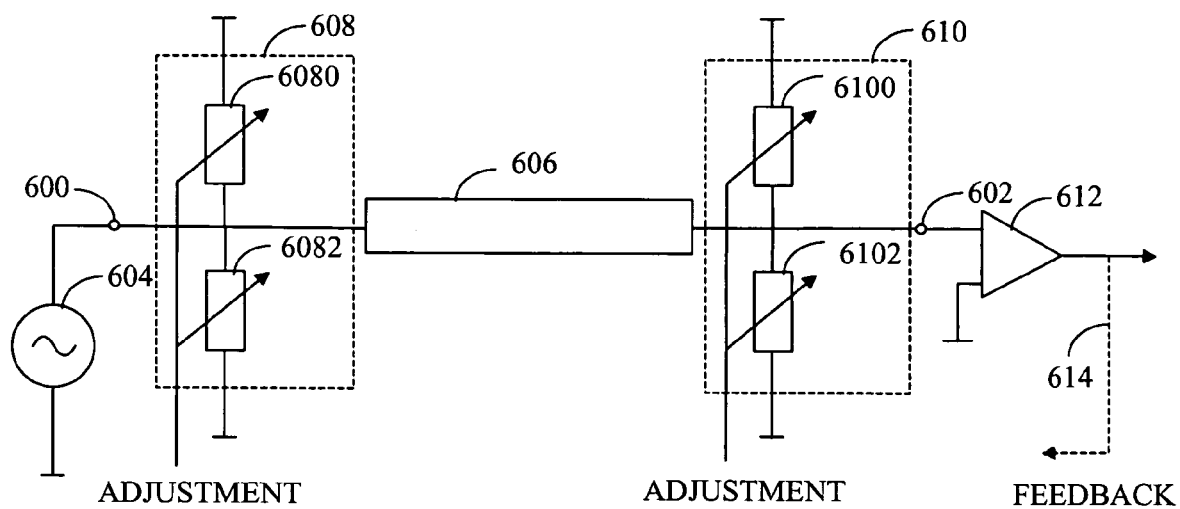
FIG. 6A shows an adjusting circuit with a transmission line.

FIG. 6A shows an example of an adjusting circuit (FIG. 2, reference number 210) for adjusting the amplitude of a signal. The adjusting circuit in FIG. 6A comprises an input terminal 600 and an output terminal 602. In general, the circuit may have a plurality of terminals for input and output. A signal generator 604, which may be a transmitter in a base station or user equipment feeds a signal to the input terminal 600. The circuit also includes a matching component 606 which has an effect on matching a signal input and a signal output to and from the terminals 600, 602. The matching component has an effect on the impedance of the circuit and a matching component with different properties can change the impedance of the circuit. The matching component 606 may be, for instance, a transmission line, the length l of which may be one fourth of a wavelength $\lambda$ of the signal, i.e. $l = \lambda/4 + n\lambda/2$, where $n = 0, 1, 2, \ldots, \infty$. Correspondingly, the phase shift $\Delta\phi$ (in radians) in the matching component can also be expressed as $\Delta\phi = \pi/2 + n\pi$, where $\pi \approx 3.1415926$. The impedance of the transmission line can be 50 ohms ($\Omega$), 75$\Omega$, 100$\Omega$, 600$\Omega$ or any other desired value. The adjusting circuit in FIG. 6A comprises two adjustable resistance units 608, 610 between the matching component 606 and ground for changing resistance at the input and the output terminals 600, 602 of the amplitude adjusting circuit. A load 612, which may be a non-linear element, such as an amplifier, can be coupled to the output terminal 602. The non-linearity in the amplitude caused by the load 612 may be cancelled with the adjusting circuit.

Each of the adjustable resistance units 608, 610 may include many components coupled in parallel and/or series, at least some of the components being adjustable. The components in the resistance units 608, 610 also have complementary reactances with respect to each other. For example, the resistance unit 608 may include adjustable impedance units 6080, 6082, and the resistance unit 610 may include adjustable impedance units 6100, 6102. The impedance unit 6080 may be inductive and the impedance unit 6082 may be capacitive, or vice versa. During the impedance units 6080, 6082 in the resistance unit 608 are adjusted, their reactances may remain opposite to each other and the adjustment may only change the resistance value of the resistance unit 608. In a similar manner, the adjustment of the impedance units 6100, 6102 having complementary reactances may change the resistance of the resistance unit 610.

An embodiment of the present solution may include feedback 614 (shown with a dashed line) from the output of the non-linear element 612 to the adjustable resistance units 608, 610 for adjusting the impedance units 6080, 6082 and 6100, 6102, but this feature is not necessary.

Figure 6B:
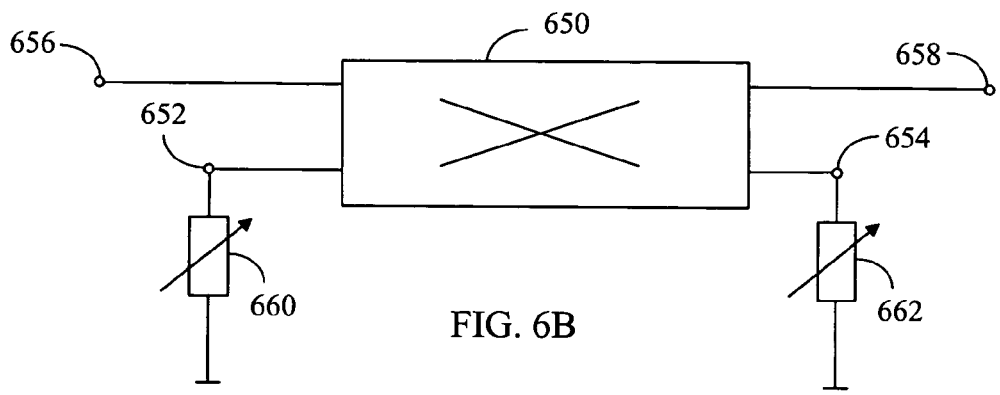
FIG. 6B shows an adjusting circuit with a directional coupler.

FIG. 6B illustrates an example where the matching component is a directional coupler 650 with four terminals 652 to 658. In this example, two terminals 652, 654 have adjustable resistance units 660, 662, but generally at least one terminal has an adjustable resistance unit.

Figure 6C:
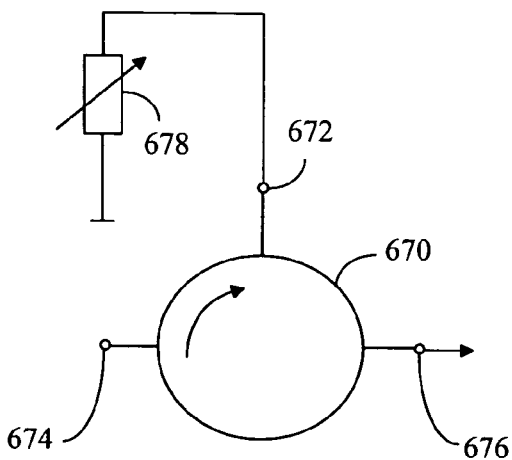
FIG. 6C shows an adjusting circuit with a circulator.

FIG. 6C illustrates an example where the matching component is a circulator 670 with three terminals 672 to 676. In this example, a terminal 672 has an adjustable resistance unit 678. The terminal 676 is an output terminal when a transmission is transferred from the terminal 674 to the terminal 676. Any other of the terminals may also have an adjustable resistance unit.

Figure 7:
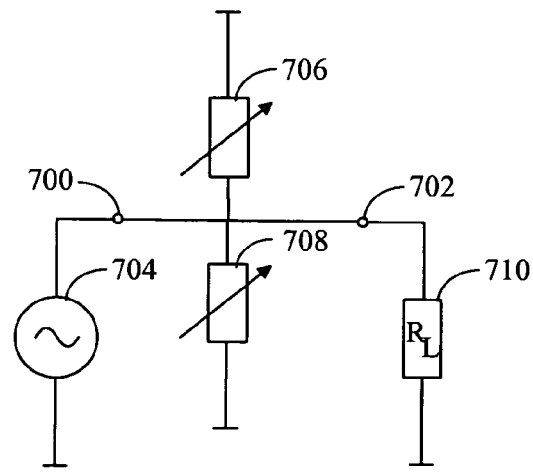
FIG. 7 shows an adjusting circuit between a signal generator and a load.

FIG. 7 shows another example of the adjusting circuit for adjusting the amplitude of a signal. The adjusting circuit in FIG. 7 comprises an input terminal 700 and an output terminal 702. In general the circuit may have a plurality of terminals for input and output. A signal generator 704 feeds a signal to the input terminal 700. A pair of adjustable impedance units 706, 708 is coupled in parallel between a signal line (the line between the terminals 700, 702) and ground. The ground may be a zero potential or any other reference level against which the signal in the signal line is detected. The impedance unit 706 may be inductive and the impedance unit 708 may be capacitive. Generally the circuit may be provided with more than one pair of adjustable impedance units such that each pair of adjustable impedance units is placed between one pair of input and output terminals. The impedance units of each pair have complementary reactances with respect to each other. A load 710, which may be a non-linear element such as an amplifier, is coupled to the output terminal 702. As in FIGS. 6A, 6B and 6C, each impedance unit may include many components coupled in parallel and/or series.

The adjusting circuit described in FIGS. 6A, 6B, 6C and 7 can be considered to be an adjustable attenuator because its changeable resistance attenuates the signal input to the load at a desired extent.

The complementary reactances of the impedance units relating to FIGS. 6A, 6B, 6C and 7 can be mathematically expressed using complex numbers such that an impedance can be considered a complex value a real part of thereof resistance and an imaginary part thereof being reactance. The reactance, in turn, is due to inductance or capacitance. An impedance Z of a parallel coupling of two impedance units $Z_1 = R_1 + jX_1$, $Z_2 = R_2 + jX_2$ can be expressed as $$Z = \frac{1}{\frac{1}{Z_1} + \frac{1}{Z_2}} = \frac{1}{\frac{1}{R_1 + jX_1} + \frac{1}{R_2 + jX_2}}, \quad (1)$$

where $R_1 + jX_1$ is the first impedance unit $Z_1$, $R_2 + jX_2$ is the second impedance unit $Z_2$, $R_1$ is the resistive part of the first impedance unit, $R_2$ is the resistive part of the second impedance unit, $X_1$ is the reactive part of the first impedance unit, $X_2$ is the reactive part of the second impedance unit, and j is the imaginary unit. The impedance Z can also be expressed as $$Z = \frac{R_1 R_2 + j(R_1 X_2 + R_2 X_1) - X_1 X_2}{R_1 + R_2 + j(X_1 + X_2)}, \quad (2)$$

which may have a real value, i.e. the impedance Z may be resistive if the resistive part $R_1$ and the resistive part $R_2$ have the same value, $R_1=R_2$, and if the reactive part $X_1$ is opposite to the reactive part $X_2$, $X_1=-X_2$. When the impedance Z is purely resistive, the values of the parallel impedances $Z_1$, $Z_2$ are complex conjugates with respect to each other, i.e. $Z_1=R_1+jX_1$, $Z_2=\overline{Z}_1=R_1-jX_1$.

Even though the invention has been described above with reference to an example according to the accompanying drawings, it is clear that the invention is not restricted thereto but can be modified in several ways within the scope of the appended claims.

What is claimed is:

1. An electronic circuit for adjusting at least one property of an input signal of a non-linear element, the circuit comprising:
   a detector for detecting a strength of an input signal;
   at least one analog controller for forming a control signal as a piecewise linear approximation of a non-linear dependency between at least one property and the strength of the input signal detected by the detector; and
   at least one adjusting circuit for adjusting the at least one property of the input signal according to the control signal from the at least one analog controller.

2. The circuit of claim 1, wherein the at least one analog controller is configured to have different dependencies between the strength of the input signal and the at least one property in different pieces of the piecewise linear approximation.

3. The circuit of claim 1, wherein the circuit further comprises a feedback from an output of a non-linear element to the at least one analog controller for changing parameters in the piecewise linear approximation according to the feedback signal.

4. The circuit of claim 1, wherein the at least one analog controller includes
   at least one voltage generator;
   at least two non-linear components, each of the at least two non-linear components biased to different voltage levels with the at least one voltage generator; and
   the analog controller is configured to combine output signals from the non-linear components into the control signal.

5. The circuit of claim 1, wherein the at least one analog controller includes
   at least one voltage generator;
   at least two diodes, each of the at least two diodes being biased to different voltage levels with the at least one voltage generator; and
   the analog controller is configured to combine output signals from the diodes into the control signal.

6. The circuit of claim 1, wherein the at least one analog controller includes
   at least two stages, including a first stage comprising a buffer and a second stage comprising at least one of:
   at least one voltage generator;
   at least two diodes having a series resistor;
   an amplifier;
   each of the at least two diodes with a resistor biased to different voltage levels with the at least one voltage generator; and
   the amplifier configured to combine signals output from the at least two diodes into a control signal.

7. The circuit of claim 1, wherein the at least one analog controller for forming the control signal includes the piecewise linear approximation of the non-linear dependency between the at least one property and the strength of the input signal, in which the at least one property comprises gain or phase.

8. An electronic circuit for adjusting an amplitude of an input signal of an amplifier, the circuit comprising:
   a detector for detecting a strength of an input signal;
   an analog controller for forming a control signal as a piecewise linear approximation of a non-linear dependency between at least one property and the strength of the input signal detected by the detector; and
   an adjusting circuit for adjusting an amplitude of the input signal according to the control signal.

9. An electronic circuit for adjusting a phase of an input signal of an amplifier, the circuit comprising:
   a detector for detecting a strength of an input signal;
   an analog controller for forming a control signal as a piecewise linear approximation of a non-linear dependency between at least one property and the strength of the input signal detected by the detector; and
   an adjusting circuit for adjusting a phase of the input signal according to the control signal.

10. An electronic circuit for adjusting at least one property of an input signal of a non-linear element, the circuit comprising:
    strength means for detecting a strength of an input signal;
    analog control means for forming a control signal as a piecewise linear approximation of a non-linear dependency between at least one property and the strength of the input signal detected by the strength means; and
    adjusting means for adjusting the at least one property of the input signal according to the control signal.

11. A method of adjusting at least one property of an input signal of a non-linear element, the method comprising:
    detecting a strength of an input signal by a detector;
    forming a control signal by at least one analog controller as a piecewise linear approximation of a non-linear dependency between at least one property and the strength of the input signal detected by the detector; and
    adjusting, by at least one adjusting circuit, the at least one property of the input signal according to the control signal from the at least one analog controller.

12. The method of claim 11, further comprising forming, by the at least one analog controller, different dependencies between the strength of the input signal and the at least one property in different pieces of the piecewise linear approximation.

13. The method of claim 11, further comprising inputting a feedback signal from an output of a non-linear element to the at least one analog controller and changing parameters in the piecewise linear approximation according to the feedback signal.

14. An electronic circuit comprising:
    detecting means for detecting a strength of an input signal;
    forming means for forming a control signal by at least one analog controller as a piecewise linear approximation of a non-linear dependency between at least one property and the strength of the input signal; and
    adjusting means for adjusting the at least one property of the input signal according to the control signal from the at least one analog controller.

* * * * *